(12) United States Patent
Duriez et al.

(10) Patent No.: US 9,698,240 B2
(45) Date of Patent: Jul. 4, 2017

(54) SEMICONDUCTOR DEVICE AND FORMATION THEREOF

(71) Applicant: Taiwan Semiconductor Manufacturing Company Limited, Hsin-Chu (TW)

(72) Inventors: Blandine Duriez, Brussels (BE); Mark van Dal, Heverlee (BE)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 254 days.

(21) Appl. No.: 14/230,203

(22) Filed: Mar. 31, 2014

(65) Prior Publication Data
US 2015/0279964 A1 Oct. 1, 2015

(51) Int. Cl.
*H01L 29/66* (2006.01)
*H01L 29/78* (2006.01)

(52) U.S. Cl.
CPC .. *H01L 29/66545* (2013.01); *H01L 29/66795* (2013.01); *H01L 29/785* (2013.01)

(58) Field of Classification Search
CPC ................................................ H01L 21/02318
See application file for complete search history.

(56) References Cited

U.S. PATENT DOCUMENTS

2009/0065850 A1* 3/2009 Oh .................. B82Y 10/00
257/324

FOREIGN PATENT DOCUMENTS

WO     2013152535 A1    10/2013

OTHER PUBLICATIONS

Corresponding Taiwan application 104100364, Taiwan Office action dated Jan. 22, 2016.

* cited by examiner

*Primary Examiner* — Mohammad Choudhry
(74) *Attorney, Agent, or Firm* — Cooper Legal Group, LLC

(57) ABSTRACT

A semiconductor device and methods of formation are provided. The semiconductor device includes a gate over a channel portion of a fin. The fin includes a first active area of the fin having a first active area top surface coplanar with a first shallow trench isolation (STI) top surface of a first STI portion of STI, and a second active area of the fin having a second active area top surface coplanar with a second STI top surface of a second STI portion of the STI. The method herein negates a need to recess at least one of the fin, the first STI portion or the second STI portion during device formation. Negating a need to recess at least one of the fin, the first STI portion or the second STI portion enhances the semiconductor device formation and is more efficient than a semiconductor device formation that requires the recessing of at least one of a fin, a first STI portion or a second STI portion.

20 Claims, 17 Drawing Sheets

SEMICONDUCTOR DEVICE AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
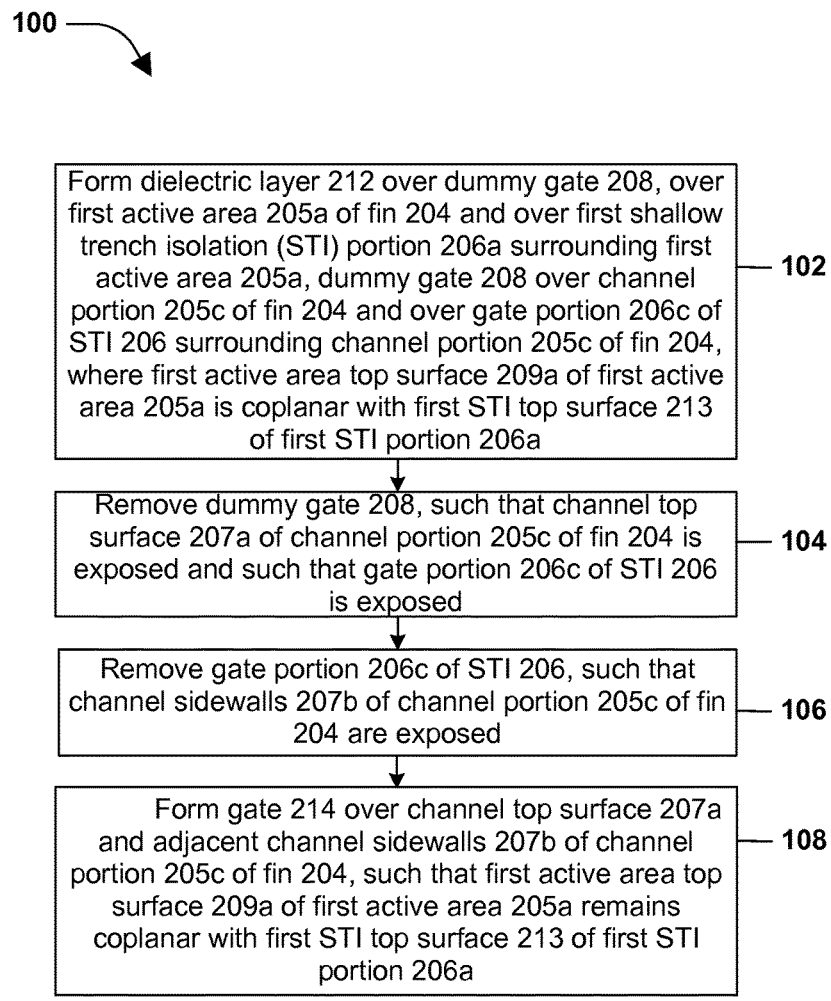
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 7:
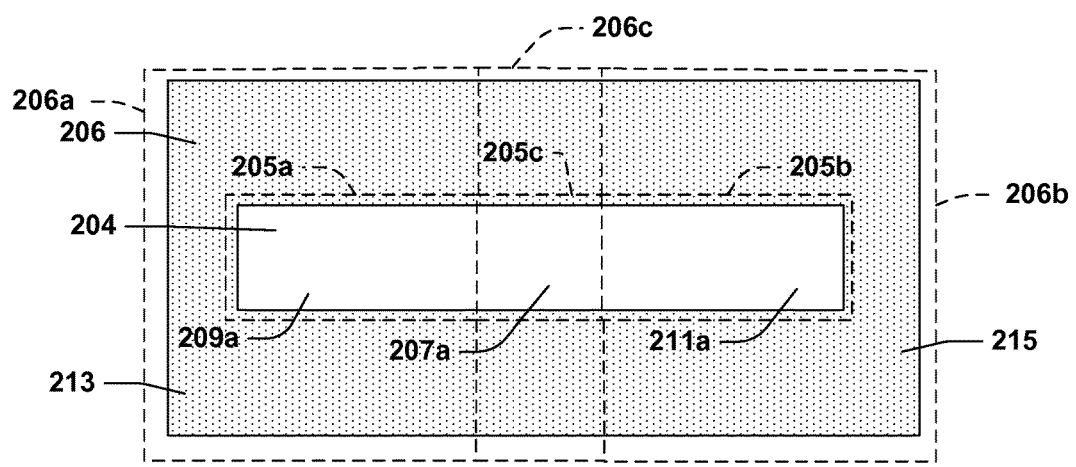
FIG. 7 is an illustration of a semiconductor device, in accordance with some embodiments.
Figure 8:
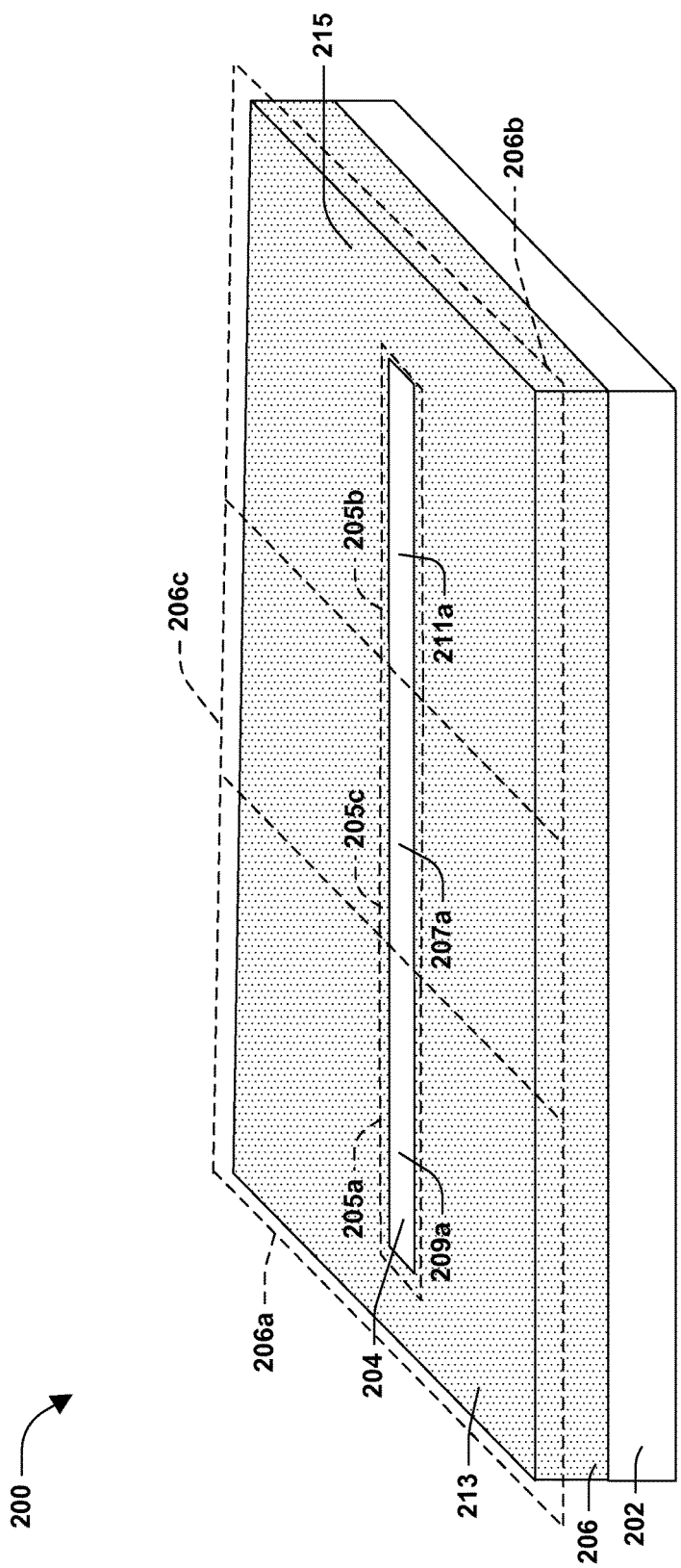
FIG. 8 is an illustration of a semiconductor device, in accordance with some embodiments.
Figure 21:
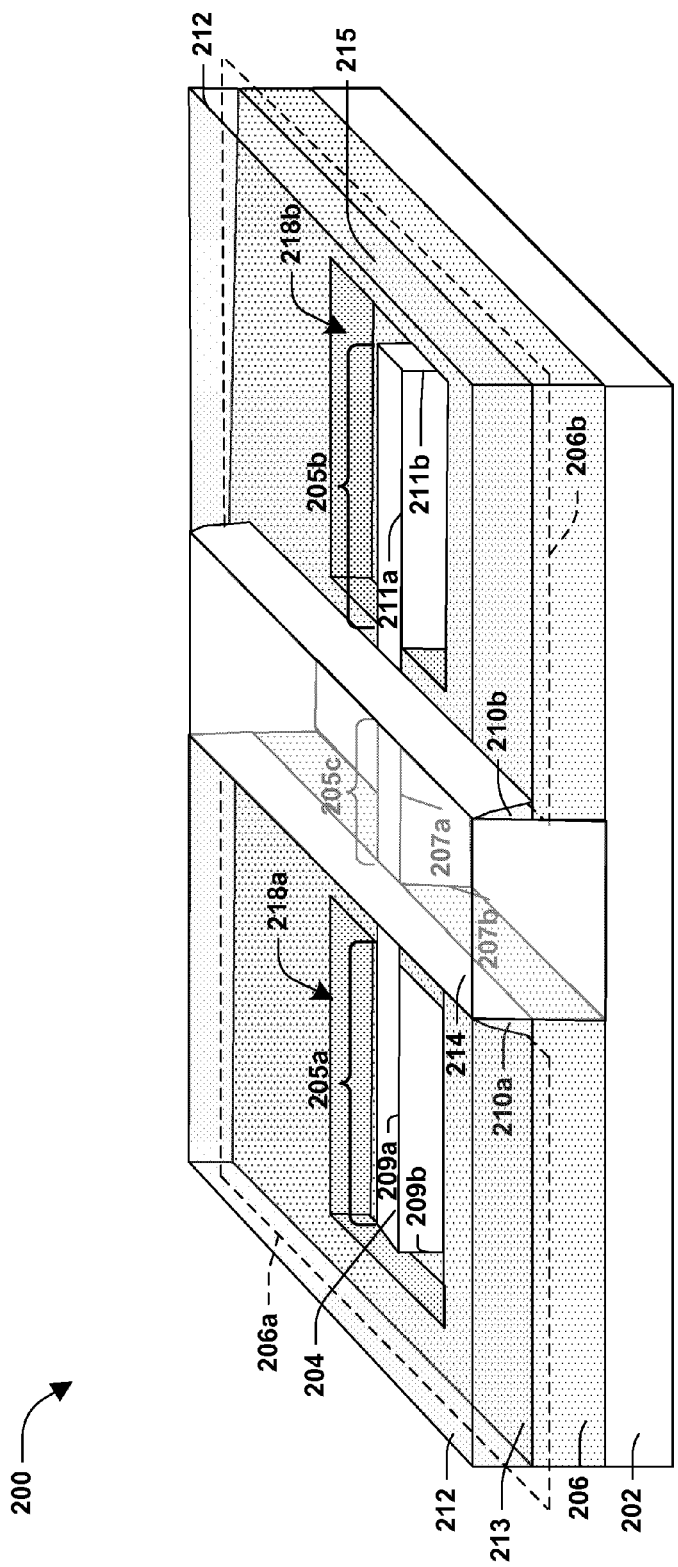
FIG. 21 is an illustration of a semiconductor device, in accordance with some embodiments.
Figure 22:
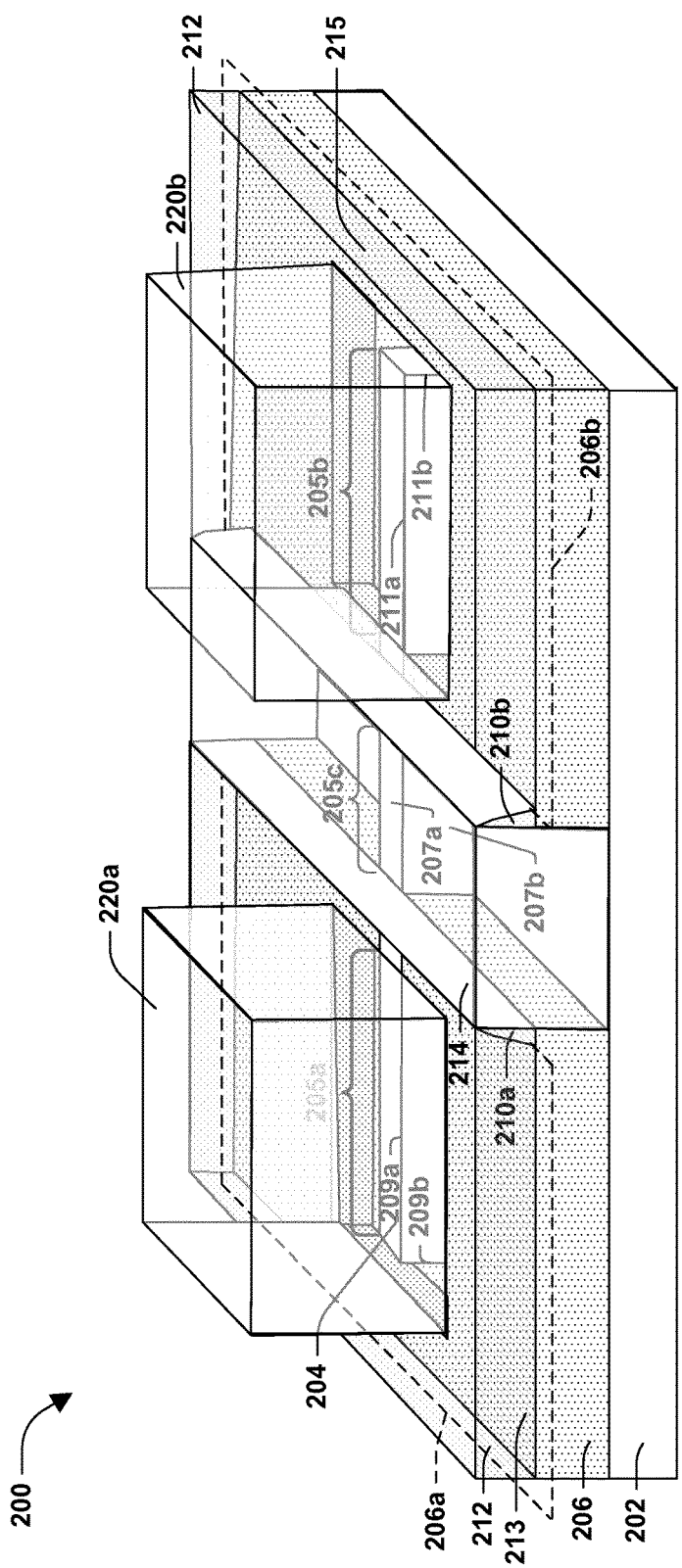
FIG. 22 is an illustration of a semiconductor device, in accordance with some embodiments.

A method 100 of forming a semiconductor device 200 is illustrated in FIG. 1, and one or more semiconductor devices formed by such methodology are illustrated in FIGS. 2-24. In some embodiments, such as illustrated in FIG. 22, the semiconductor device 200 comprises a gate 214 over a channel top surface 207*a* of a channel portion 205*c* of a fin 204 and adjacent channel sidewalls 207*b* of the channel portion 205*c* of the fin 204. In some embodiments, the fin 204 comprises a first active area 205*a* of the fin 204 having a first active area top surface 209*a* coplanar with a first shallow trench isolation (STI) top surface 213 of a first STI portion 206*a* of STI 206. In some embodiments, the first STI portion 206*a* surrounds the first active area 205*a*. In some embodiments, the fin 204 comprises a second active area 205*b* having a second active area top surface 211*a* coplanar with a second STI top surface 215 of a second STI portion 206*b* of the STI 206. In some embodiments, the second STI portion 206*b* surrounds the second active area 205*b*. In some embodiments, in the method 100, which forms the semiconductor device 200, a dielectric layer 212 is formed over the first active area 205*a*, the first STI portion 206*a*, the second active area 205*b* and the second STI portion 206*b*. In some embodiments, as illustrated in FIG. 17, a gate portion 206*c*, as illustrated in FIG. 8, of the STI 206 is recessed after removal of a dummy gate 208, as illustrated in FIG. 14, where the gate portion 206*c* of the STI 206 surrounds the channel portion 205*c*, as illustrated in FIG. 8, thus negating a need to recess at least one of the fin 204, the first STI portion 206a or the second STI portion 206b. In some embodiments, negating the need to recess at least one of the fin 204, the first STI portion 206a or the second STI portion 206b enhances the method 100, such that the semiconductor device 200 formation is more efficient than a method that requires the recessing of at least one of a fin, a first STI portion or a second STI portion.

Figure 2:
FIG. 2 is an illustration of a semiconductor device, in accordance with some embodiments.
Figure 3:
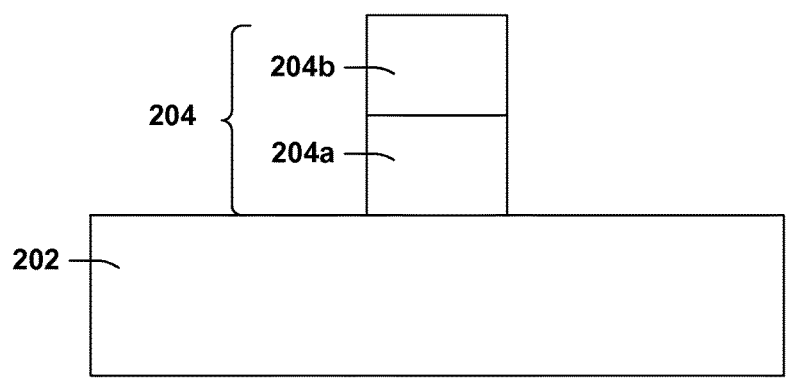
FIG. 3 is an illustration of a semiconductor device, in accordance with some embodiments.
Figure 4:
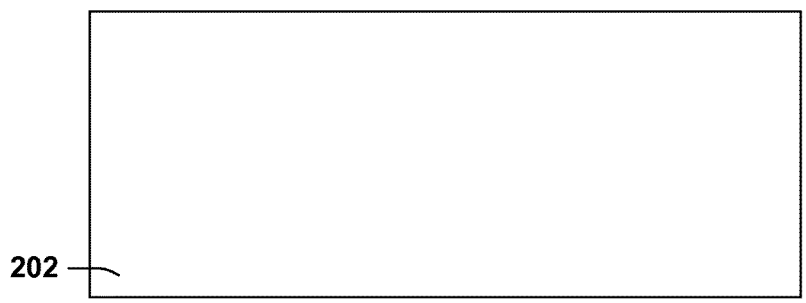
FIG. 4 is an illustration of a semiconductor device, in accordance with some embodiments.
Figure 5:
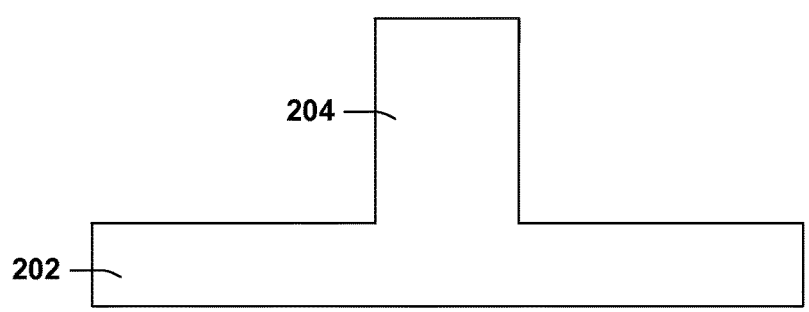
FIG. 5 is an illustration of a semiconductor device, in accordance with some embodiments.
Figure 6:
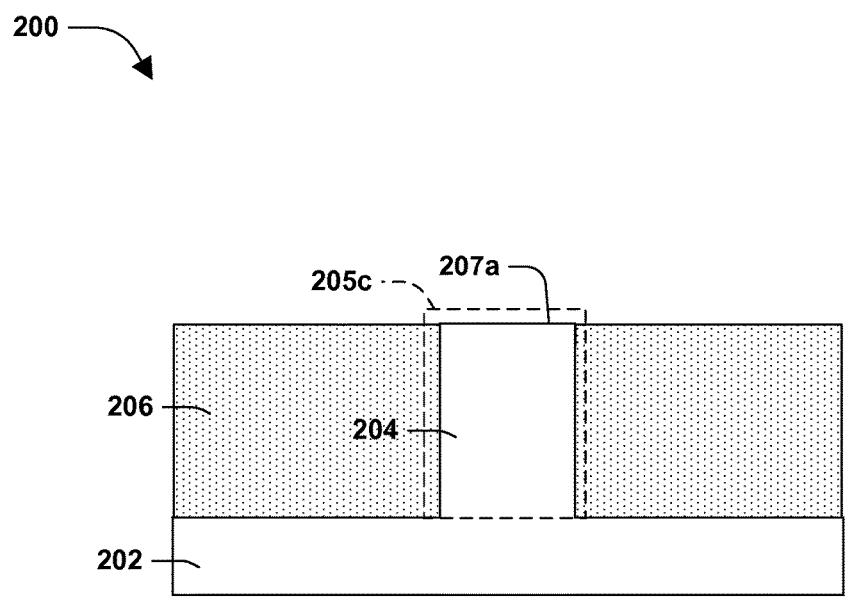
FIG. 6 is an illustration of a semiconductor device, in accordance with some embodiments.
Figure 9:
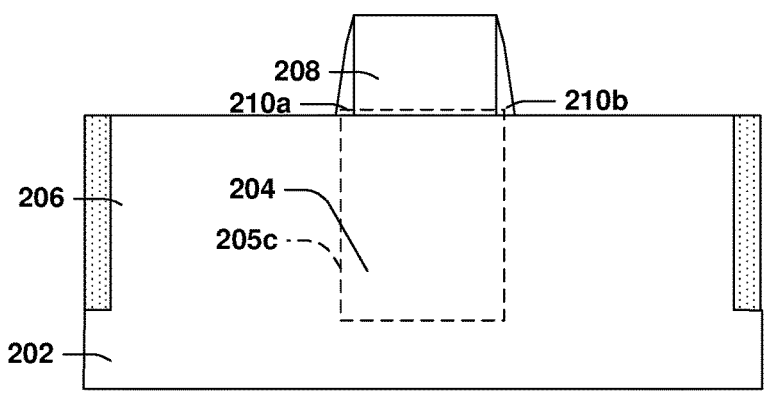
FIG. 9 is an illustration of a semiconductor device, in accordance with some embodiments.
Figure 10:
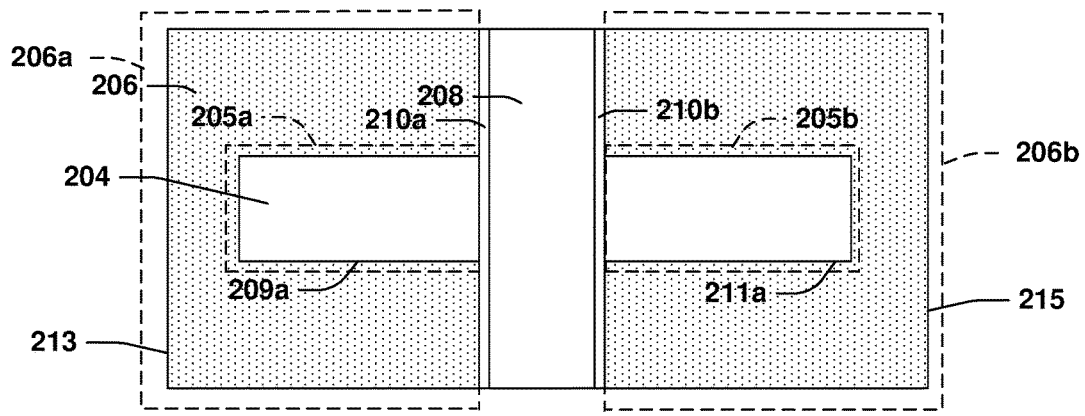
FIG. 10 is an illustration of a semiconductor device, in accordance with some embodiments.
Figure 11:
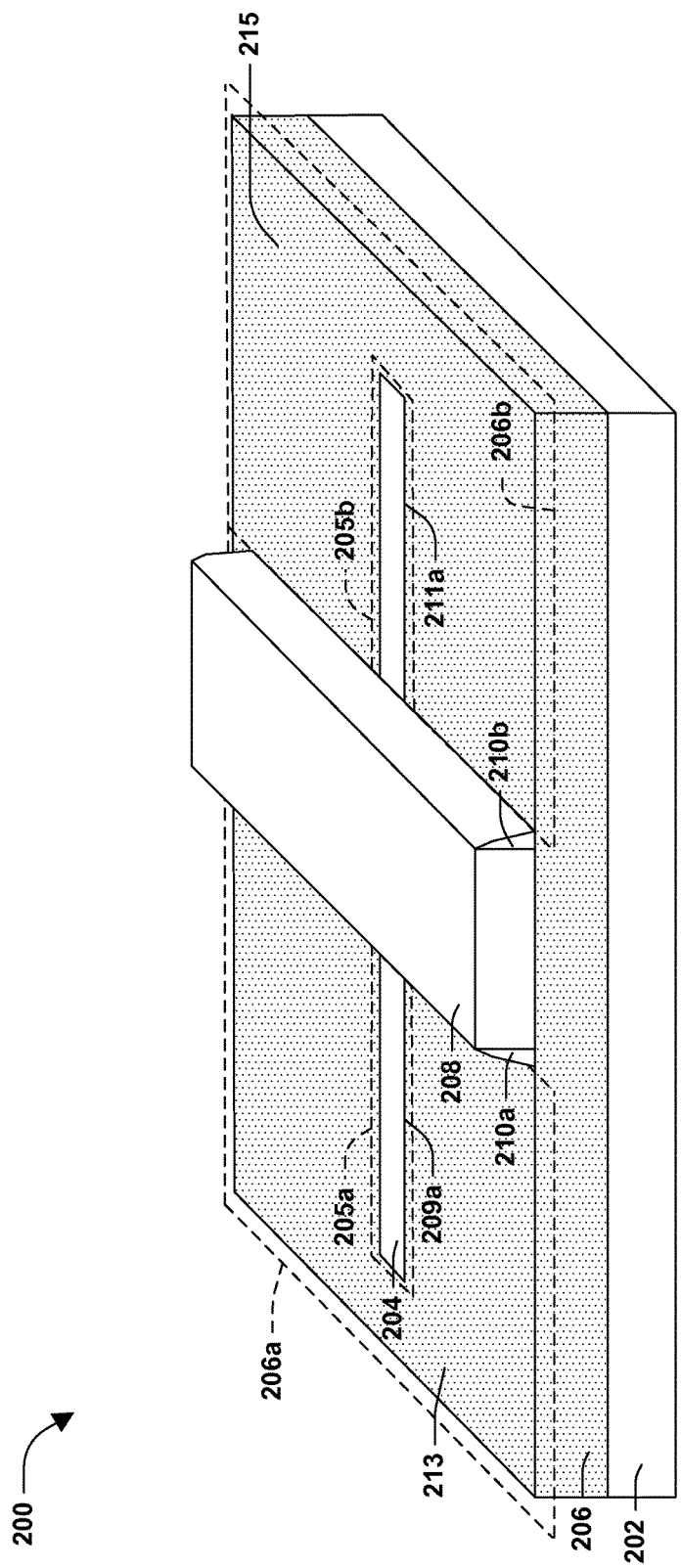
FIG. 11 is an illustration of a semiconductor device, in accordance with some embodiments.
Figure 12:
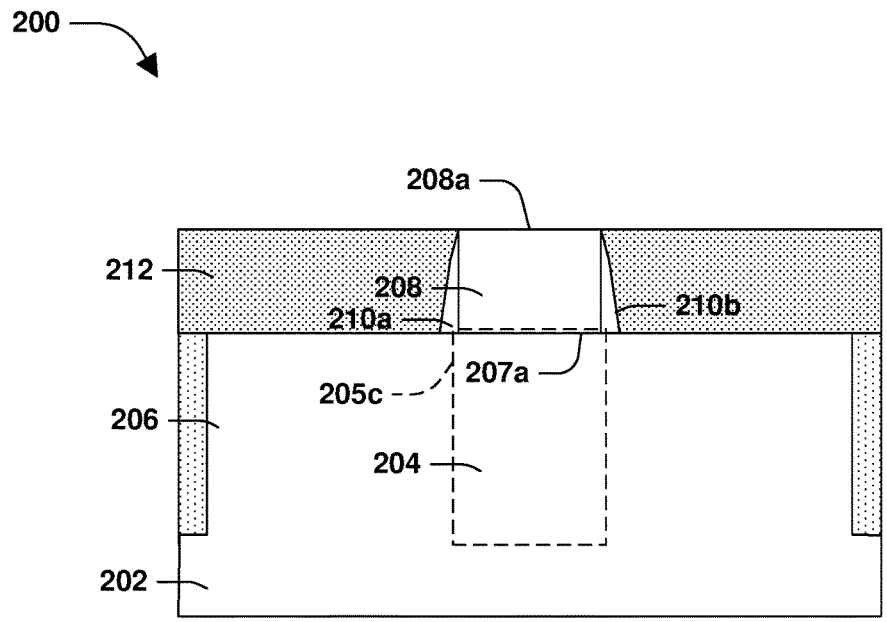
FIG. 12 is an illustration of a semiconductor device, in accordance with some embodiments.
Figure 13:
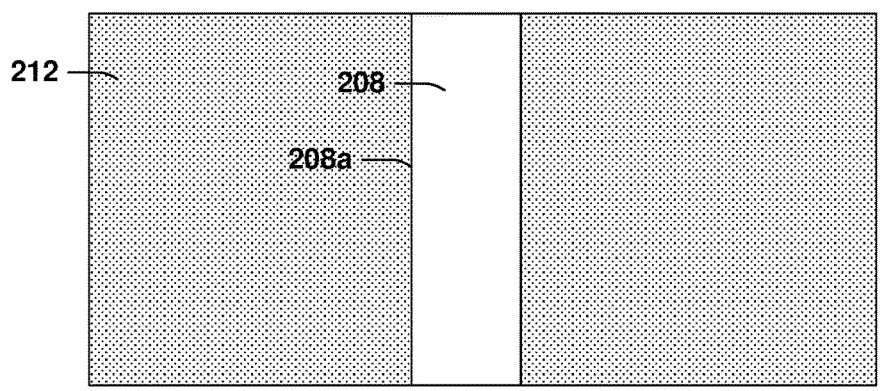
FIG. 13 is an illustration of a semiconductor device, in accordance with some embodiments.
Figure 14:
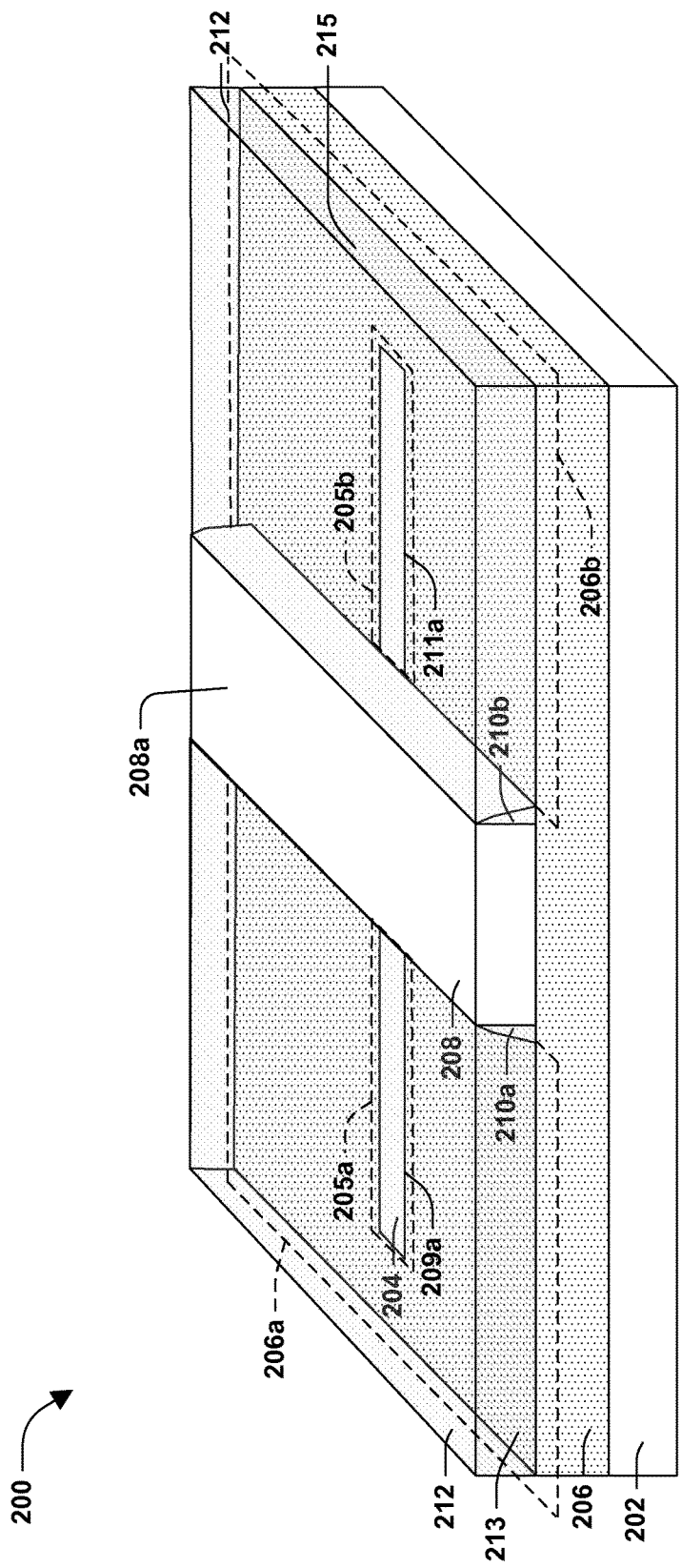
FIG. 14 is an illustration of a semiconductor device, in accordance with some embodiments.

At 102 of method of 100, as illustrated in FIGS. 12, 13 and 14, the dielectric layer 212 is formed over the dummy gate 208, the first active area 205a of the fin 204 and over the first STI portion 206a surrounding the first active area 205a, where the dummy gate 208 is over the channel portion 205c of the fin 204 and the gate portion 206c of the STI 206, where the gate portion 206c surrounds the channel portion 205c of the fin 204, and where the first active area top surface 209a of the first active area 205a is coplanar with the first STI top surface 213 of the first STI portion 206a, according to some embodiments. In some embodiments, FIG. 13 illustrates a top down or overview of FIG. 12 and FIG. 14 is a 3D view of the semiconductor device 200 as illustrated in FIG. 12. In some embodiments, the dielectric layer 212 is formed over the second active area 205b of the fin 204 and over the second STI portion 206b of the STI 206 surrounding the second active area 205b. Turning to FIG. 2, a first layer 204a is formed over a substrate 202, where the first layer 204a has a first etch selectivity that is different than a substrate etch selectivity of the substrate 202. In some embodiments, a second layer 204b is formed over the first layer 204a, where the second layer 204b has a second etch selectivity that is substantially similar to the substrate etch selectivity. In some embodiments, such as illustrated in FIG. 3, the first layer 204a and the second layer 204b are patterned to form the fin 204, such that the fin 204 comprises the first layer 204a and the second layer 204b. In some embodiments, the first layer 204a comprises at least one of silicon, germanium or oxide and the second layer 204b comprises at least one of silicon or germanium. In some embodiments, such as illustrated in FIGS. 4 and 5, the substrate 202 is patterned to form the fin 204. In some embodiments, the substrate 202 comprises an epitaxial layer, a silicon-on-insulator (SOI) structure, a wafer, or a die formed from a wafer, according to some embodiments. In some embodiments, the substrate 202 comprises at least one of silicon or germanium. In some embodiments, such as illustrated in FIG. 6, the STI 206 is formed over the substrate 202. In some embodiments, the STI 206 comprises at least one of an oxide or a nitride. In some embodiments, such as illustrated in FIGS. 7 and 8, where FIG. 7 illustrates a top down or overview of FIG. 6 and FIG. 8 illustrates a 3D view of the semiconductor device 200 as illustrated in FIG. 6, the STI 206 is formed such that the first active area top surface 209a of the first active area 205a, the channel top surface 207a of the channel portion 205c and the second active area top surface 211a of the second active area 205b are exposed. In some embodiments, at least one the first active area top surface 209a is coplanar with the first STI top surface 213 or the second active area top surface 211a is coplanar with the second STI top surface 215. In some embodiments, such as illustrated in FIGS. 9, 10 and 11, the dummy gate 208 is formed over the channel portion 205c of the fin 204. In some embodiments, FIG. 10 illustrates a top down or overview of FIG. 9 and FIG. 11 illustrates a 3D view of the semiconductor device 200 as illustrated in FIG. 9. In some embodiments, the dummy gate 208 comprises an inert material. In some embodiments, spacers 210a and 210b are formed adjacent the dummy gate 208. In some embodiments, the spacers 210a and 210b comprises a nitride. In some embodiments, such as illustrated in FIGS. 12, 13 and 14, the dielectric layer 212 is formed over the dummy gate 208, the first active area 205a, the first STI portion 206a, the channel portion 205c, the gate portion 206c of the STI 206, the second active area 205b and the second STI portion 206b. In some embodiments, a nitride layer (not shown) is formed over the dummy gate 208, the first active area 205a, the first STI portion 206a, the channel portion 205c, the gate portion 206c of the STI 206, the second active area 205b and the second STI portion 206b prior to the dielectric layer 212 formation. In some embodiments, a portion of the dielectric layer 212 is removed, such as by chemical mechanical planarization (CMP), such that a dummy gate top surface 208a of the dummy gate 208 is exposed.

Figure 15:
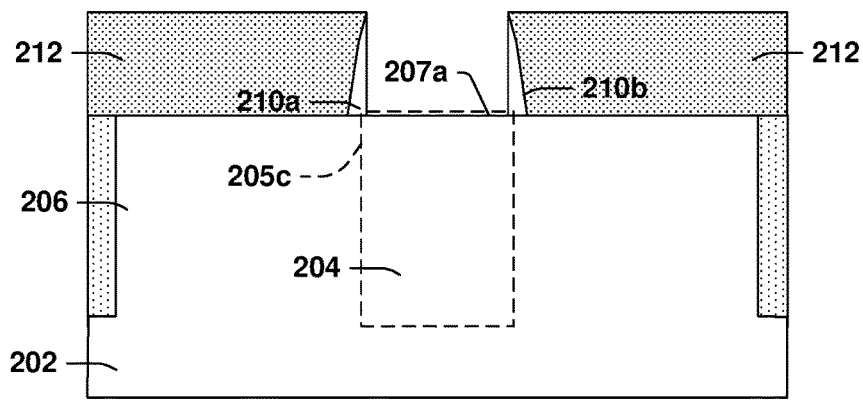
FIG. 15 is an illustration of a semiconductor device, in accordance with some embodiments.
Figure 16:
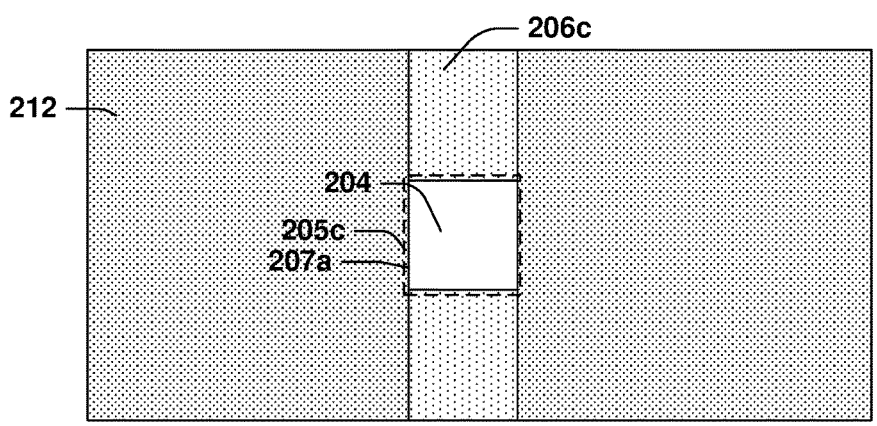
FIG. 16 is an illustration of a semiconductor device, in accordance with some embodiments.
Figure 17:
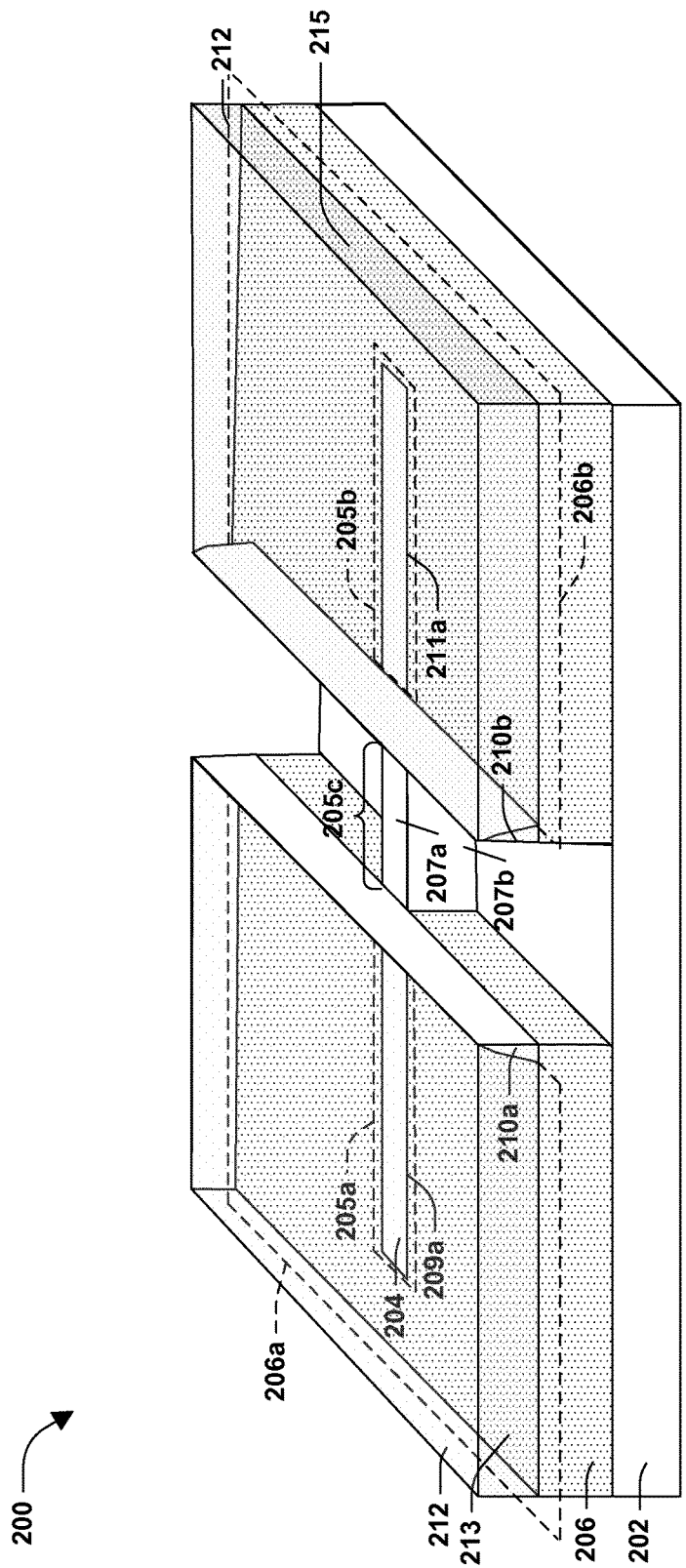
FIG. 17 is an illustration of a semiconductor device, in accordance with some embodiments.

At 104 of method of 100, as illustrated in FIGS. 15 and 16, the dummy gate 208 is removed, such that the channel top surface 207a of the channel portion 205c of the fin 204 is exposed and such that the gate portion 206c of the STI 206 is exposed, according to some embodiments. In some embodiments, FIG. 16 illustrates a top down or overview of FIG. 15. In some embodiments, the dummy gate 208 is removed by etching.

Figure 19:
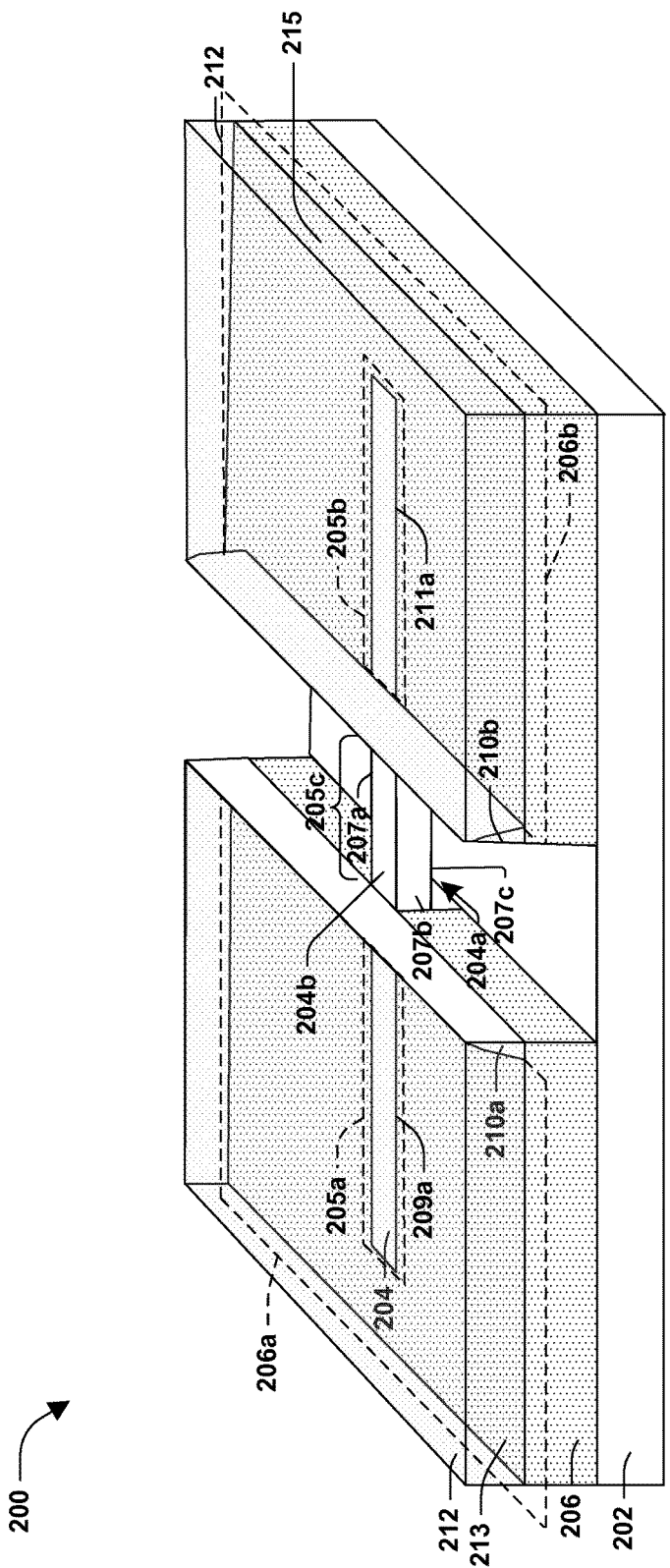
FIG. 19 is an illustration of a semiconductor device, in accordance with some embodiments.

At 106 of method of 100, as illustrated in FIG. 17, the gate portion 206c of the STI 206 is removed, such that the channel sidewalls 207b of the channel portion 205c of the fin 204 are exposed, according to some embodiments. In some embodiments, the gate portion 206c of the STI 206 is removed by selective etching, where the etch is selective for the STI 206. In some embodiments, such as illustrated in FIG. 19, where the fin 204 comprises the first layer 204a and the second layer 204b, as illustrated in FIG. 3, the selective etch removes the first layer 204a of the fin 204, such that a channel bottom surface 207c of the channel portion 205c is exposed.

Figure 18:
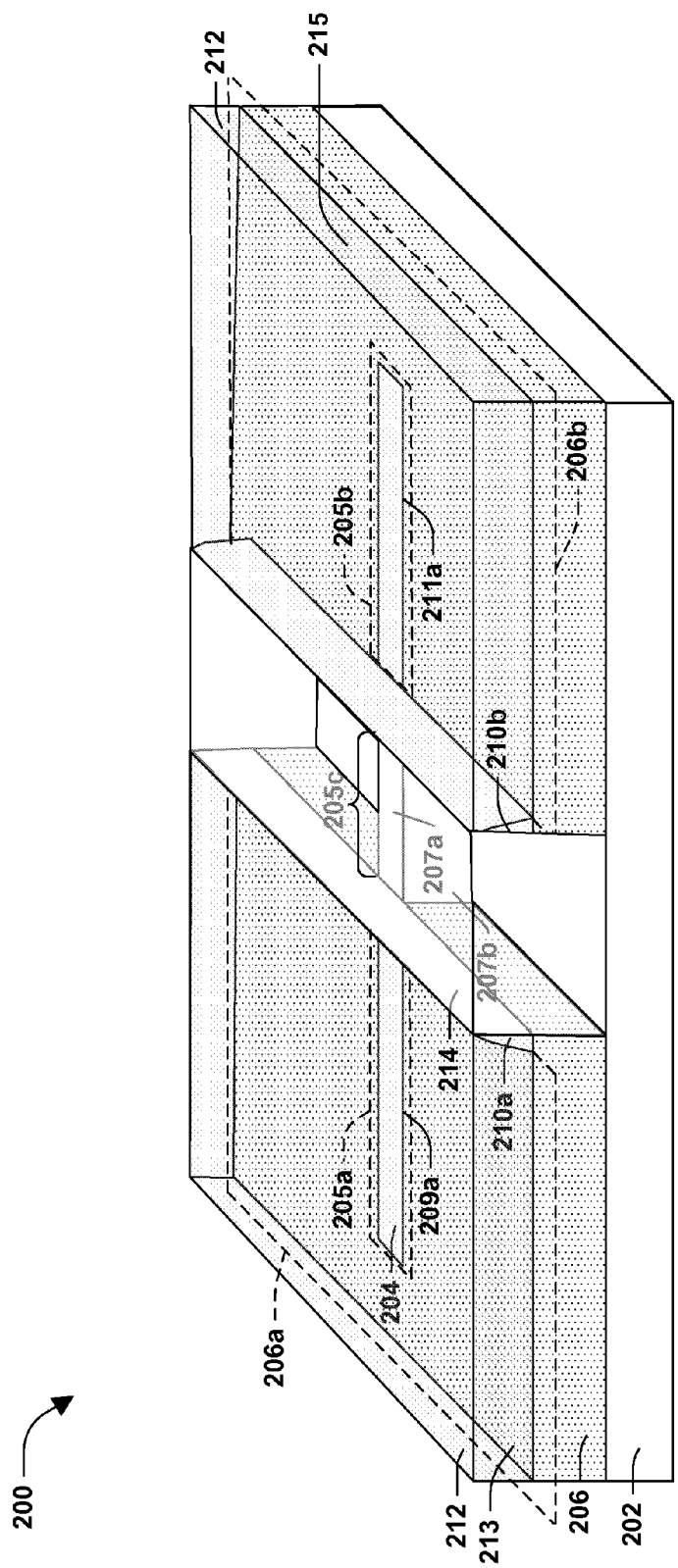
FIG. 18 is an illustration of a semiconductor device, in accordance with some embodiments.
Figure 20:
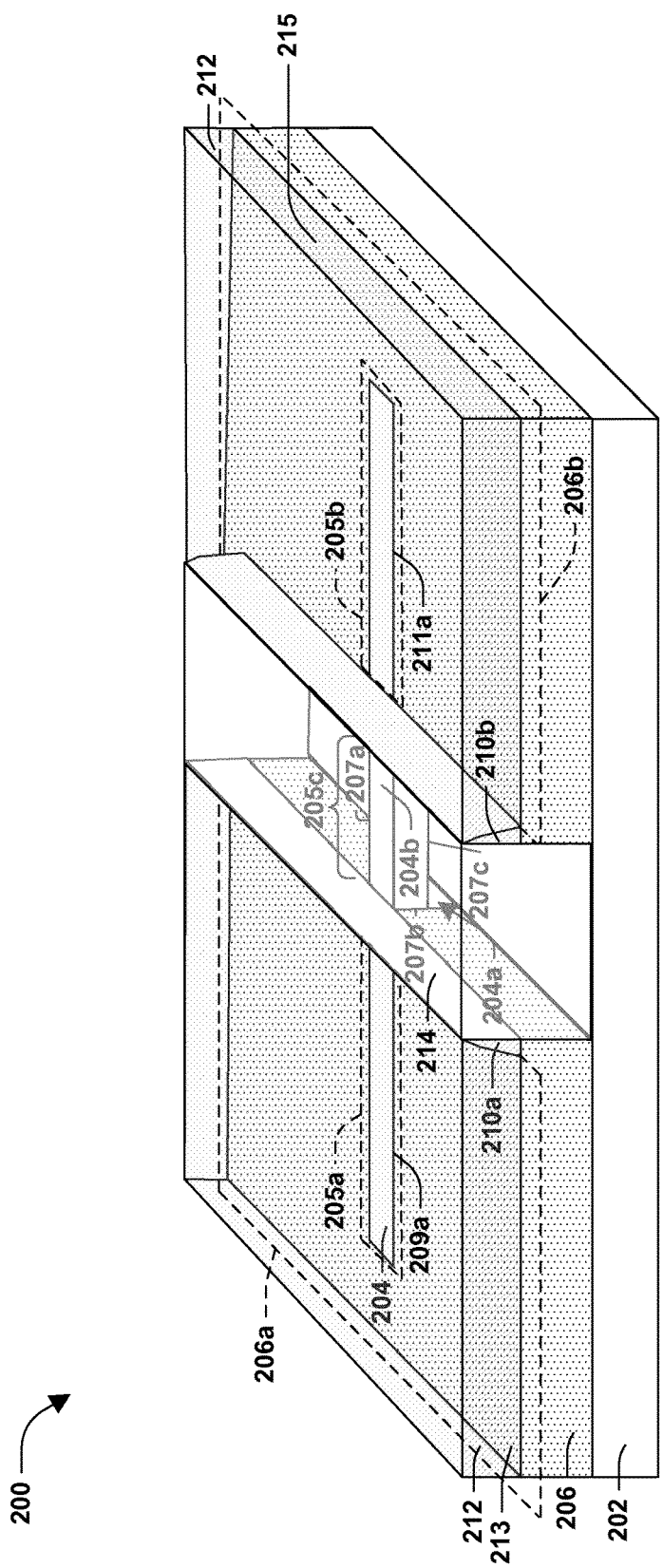
FIG. 20 is an illustration of a semiconductor device, in accordance with some embodiments.
Figure 23:
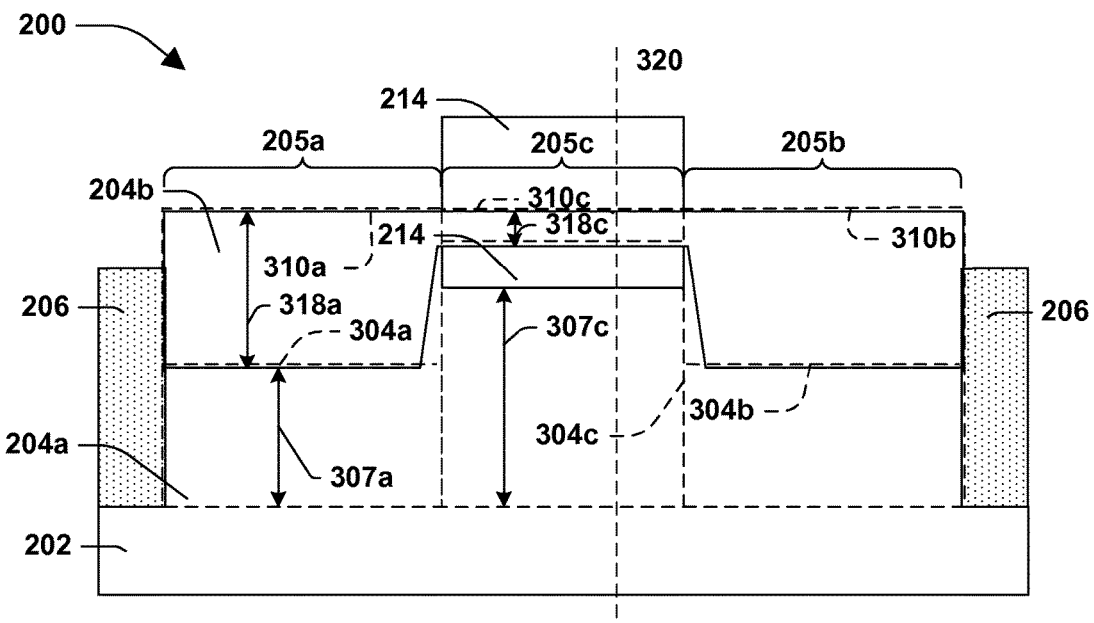
FIG. 23 is an illustration of a semiconductor device, in accordance with some embodiments.
Figure 24:
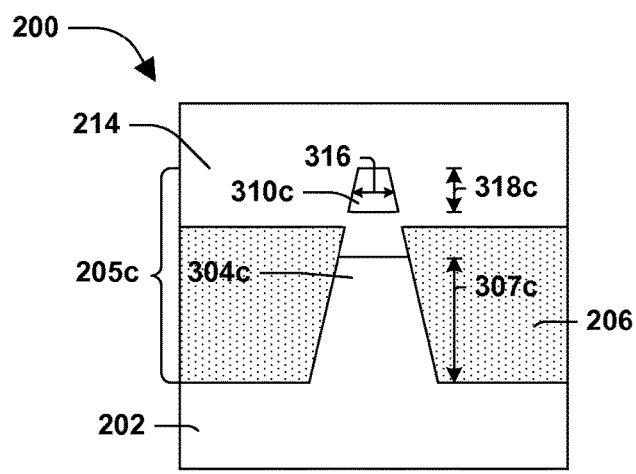
FIG. 24 is an illustration of a semiconductor device, in accordance with some embodiments.

At 108 of method of 100, as illustrated in FIG. 18, the gate 214 is formed over the channel top surface 207a and adjacent or touching the channel sidewalls 207b of the channel portion 205c of the fin 204, such that the first active area top surface 209a of the first active area 205a remains coplanar with the first STI top surface 213 of the first STI portion 206a, according to some embodiments. In some embodiments, the gate 214 comprises a gate electrode comprising a conductive material over a gate dielectric, the gate dielectric in contact with the channel portion 205c. In some embodiments, such as illustrated in FIG. 20, where the selective etch exposes the channel bottom surface 207c, the gate 214 is formed over the channel top surface 207a, adjacent the channel sidewalls 207b and under the channel bottom surface 207c, such that the gate 214 surrounds the channel portion 205c. In some embodiments, such as illustrated in FIG. 21, a part of the first STI portion 206a is removed to expose first active area sidewalls 209b of the first active area 205a to form a first active area opening 218a. In some embodiments, a part of the second STI portion 206b is removed to expose second active area sidewalls 211b of the second active area 205b to form a second active area opening 218b. In some embodiments, at least one of the part of the first STI portion 206a or the part of the second STI portion 206b is removed by selective etch, such that the etch causes little to no damage to the first active area 205a or the second active area 205b. In some embodiments, such as illustrated in FIG. 22, an epitaxial (Epi) cap 220a is formed within the first active area opening 218a. In some embodiments, the Epi cap 220a is grown. In some embodiments, the Epi cap 220a comprises at least one of germanium or silicon. In some embodiments, a contact 220b is formed within the second active area opening 218b. In some embodiments, the contact 220b is formed by deposition. In some embodiments, the contact 220b comprises metal. In some embodiments, such as when the Epi cap 220a is formed in the first active area opening 218a, an Epi cap is formed in the second active area opening 218b. In some embodiments, such as when the contact 220b is formed in the second active area opening 218b, a contact is formed in the first active area opening 218a. In some embodiments, such as illustrated in FIG. 23, the semiconductor device 200 is formed using the method 100, where the first layer 204a comprises at least one silicon or germanium and the second layer 204b over the first layer 204a comprises at least one of silicon, germanium, indium, arsenic, gallium, or antimony. In some embodiments, the first active area 205a comprises an upper active part 310a formed from the second layer 204b and a lower active part 304a formed from the first layer 204a. In some embodiments, the upper active part 310a has an upper active part height 318a. In some embodiments, the upper active part height 318a is between about 10 nm to about 100 nm. In some embodiments, the channel portion 205c comprises an upper channel part 310c formed from the second layer 204b and a lower channel part 304c formed from the first layer 204a. In some embodiments, the upper channel part 310c has an upper channel part height 318c that is less than the upper active part height 318a. In some embodiments, the upper channel part height 318c is between 1 nm to about 50 nm. In some embodiments, the lower channel part 304c has a lower channel part height 307c. In some embodiments, the lower active part 304a has a lower active part height 307a, where the lower active channel part height 307c is greater than the lower active part height 307a. In some embodiments, the second active area 205b has substantially the same composition as the first active area 205a. Turning to FIG. 24, which illustrates a cross sectional view of FIG. 23 along a line 320, the upper active part 310c has an upper active part width 316 between about 4 nm to about 30 nm. In some embodiments, the gate 214 surrounds the upper active part 310c. In some embodiments, the method 100, as described above, negates the need to recess at least one of the fin 204, the first STI portion 206a or the second STI portion 206b. In some embodiments, negating the need to recess at least one of the fin 204, the first STI portion 206a or the second STI portion 206b enhances the method 100, such that the semiconductor device 200 formation is more efficient than a method that requires the recessing of at least one of a fin, a first STI portion or a second STI portion.

According to some embodiments, a method of forming a semiconductor device comprises forming a dielectric layer over a dummy gate, over a first active area of a fin and over a first shallow trench isolation (STI) portion surrounding the first active area, the dummy gate over a channel portion of the fin and over a gate portion of the STI surrounding the channel portion of the fin, where a first active area top surface of the first active area is coplanar with a first STI top surface of the first STI portion. According to some embodiments, the method of forming a semiconductor device comprises removing the dummy gate, such that a channel top surface of the channel portion of the fin is exposed and such that the gate portion of the STI is exposed. According to some embodiments, the method of forming a semiconductor device comprises removing the gate portion of the STI, such that channel sidewalls of the channel portion of the fin are exposed and forming a gate over the channel top surface and adjacent the channel sidewalls of the channel portion of the fin, such that the first active area top surface of the first active area remains coplanar with the first STI top surface of the first STI portion.

According to some embodiments, a semiconductor device comprises a gate over a channel top surface of a channel portion of a fin and adjacent channel sidewalls of the channel portion of the fin. In some embodiments, a first active area of the fin has a first active area top surface coplanar with a first shallow trench isolation (STI) top surface of a first STI portion, the first STI portion surrounding the first active area.

According to some embodiments, a method of forming a semiconductor device comprises forming a dielectric layer over a dummy gate, over a first active area of a fin, over a second active area of the fin, over a first shallow trench isolation (STI) portion surrounding the first active area and over a second STI portion surrounding the second active area. In some embodiments, the dummy gate is over a channel portion of the fin and over a gate portion of the STI surrounding the channel portion of the fin, where a first active area top surface of the first active area is coplanar with a first STI top surface of the first STI portion and a second active area top surface of the second active area is coplanar with a second STI top surface of the second STI portion. According to some embodiments, the method of forming a semiconductor device comprises removing the dummy gate, such that a channel top surface of the channel portion of the fin is exposed and such that the gate portion of the STI is exposed and removing the gate portion of the STI, such that channel sidewalls of the channel portion of the fin are exposed. According to some embodiments, the method of forming a semiconductor device comprises forming a gate over the channel top surface and adjacent the channel sidewalls of the channel portion of the fin, such that the first active area top surface of the first active area remains coplanar with the first STI top surface of the first STI portion and the second active area top surface of the second active area remains coplanar with the second STI top surface of the second STI portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device comprising:
    forming a dielectric layer over a dummy gate, over a first active area of a fin and over a first shallow trench isolation (STI) portion surrounding the first active area, the dummy gate over a channel portion of the fin and over a gate portion of the STI surrounding the channel portion of the fin, where a first active area top surface of the first active area is coplanar with a first STI top surface of the first STI portion;
    removing the dummy gate, such that a channel top surface of the channel portion of the fin is exposed and such that the gate portion of the STI is exposed;
    removing the gate portion of the STI, such that channel sidewalls of the channel portion of the fin are exposed; and
    forming a gate over the channel top surface and adjacent the channel sidewalls of the channel portion of the fin, such that the first active area top surface of the first active area remains coplanar with the first STI top surface of the first STI portion.

2. The method of claim 1, comprising forming spacers adjacent the dummy gate, prior to the forming a dielectric layer.

3. The method of claim 1, comprising:
    forming a first layer over a substrate, the first layer having a first etch selectivity that is different than a substrate etch selectivity;
    forming a second layer over the first layer, the second layer having a second etch selectivity that is substantially similar to the substrate etch selectivity; and
    patterning the first layer and the second layer to form the fin.

4. The method of claim 1, comprising performing chemical mechanical planarization (CMP) on the dielectric layer to expose a dummy gate top surface of the dummy gate, prior to the removing the dummy gate.

5. The method of claim 1, the removing the dummy gate comprising etching.

6. The method of claim 1, comprising forming a nitride layer over the dummy gate, over the first active area and over the first STI portion prior to the forming a dielectric layer.

7. The method of claim 1, comprising removing a part of the first STI portion to expose first active area sidewalls of the first active area to form a first active area opening.

8. The method of claim 7, forming at least one of an epitaxial (Epi) cap or a contact within the first active area opening.

9. A method of forming a semiconductor device comprising:
    forming a dielectric layer over a dummy gate, over a first active area of a fin, over a second active area of the fin, over a first shallow trench isolation (STI) portion surrounding the first active area and over a second STI portion surrounding the second active area, the dummy gate over a channel portion of the fin and over a gate portion of the STI surrounding the channel portion of the fin, where a first active area top surface of the first active area is coplanar with a first STI top surface of the first STI portion and a second active area top surface of the second active area is coplanar with a second STI top surface of the second STI portion;
    removing the dummy gate, such that a channel top surface of the channel portion of the fin is exposed and such that the gate portion of the STI is exposed;
    removing the gate portion of the STI, such that channel sidewalls of the channel portion of the fin are exposed; and
    forming a gate over the channel top surface and adjacent the channel sidewalls of the channel portion of the fin, such that the first active area top surface of the first active area remains coplanar with the first STI top surface of the first STI portion and the second active area top surface of the second active area remains coplanar with the second STI top surface of the second STI portion.

10. The method of claim 9, comprising forming spacers adjacent the dummy gate, prior to the forming a dielectric layer.

11. The method of claim 9, comprising performing chemical mechanical planarization (CMP) on the dielectric layer to expose a dummy gate top surface of the dummy gate, prior to the removing the dummy gate.

12. The method of claim 9, comprising:

forming a first layer over a substrate, the first layer having a first etch selectivity that is different than a substrate etch selectivity;

forming a second layer over the first layer, the second layer having a second etch selectivity that is substantially similar to the substrate etch selectivity; and patterning the first layer and the second layer to form the fin.

13. The method of claim 9, comprising forming a nitride layer over the dummy gate, over the first active area, over the second active area, over the first STI portion and over the second STI portion prior to the forming a dielectric layer.

14. The method of claim 9, comprising removing a part of the first STI portion to expose first active area sidewalls of the first active area to form a first active area opening and forming at least one of an epitaxial (Epi) cap or a contact within the first active area opening.

15. The method of claim 9, comprising:

exposing a channel bottom surface of the channel portion of the fin; and forming the gate under the channel bottom surface of the channel portion of the fin.

16. A method of forming a semiconductor device comprising:

defining a fin over a substrate;

forming a dielectric layer over the substrate, the dielectric layer in contact with a sidewall of the fin;

forming a dummy gate over the fin and over the dielectric layer, the dummy gate contacting a top surface of the fin and a top surface of the dielectric layer;

forming a spacer, the spacer in contact with the dummy gate;

forming a second dielectric layer over the dielectric layer after the forming a spacer, the second dielectric layer in contact with the top surface of the dielectric layer;

removing the dummy gate to expose a portion of the fin and a portion of the dielectric layer;

removing the portion of the dielectric layer to define an opening; and forming a gate in the opening and over the portion of the fin.

17. The method of claim 16, the gate comprising a gate dielectric in contact with a sidewall and a top surface of the portion of the fin.

18. The method of claim 16, the removing the portion of the dielectric layer comprising exposing a portion of the substrate.

19. The method of claim 16, the removing the dummy gate comprising exposing a sidewall of the spacer.

20. The method of claim 16, comprising:

etching the second dielectric layer to expose a second portion of the fin; and growing an epitaxial cap over the second portion of the fin.

* * * * *